United States Patent [19]

Crouch et al.

[11] 3,793,570

[45] Feb. 19, 1974

[54] COMPACT POWER SEMICONDUCTOR DEVICE AND METHOD OF MAKING SAME

[75] Inventors: David P. Crouch; Frank X. Huber, Jr., both of Kokomo, Ind.

[73] Assignee: General Motors Corporation, Detroit, Mich.

[22] Filed: Sept. 26, 1968

[21] Appl. No.: 762,717

[52] U.S. Cl. ..... 317/234 R, 317/234 A, 317/234 E, 317/234 G

[51] Int. Cl. .......... H01l 1/18, H01l 1/06, H01l 1/12

[58] Field of Search 317/234 A, 234 E, 234 G, 234 J, 317/234 N; 29/580, 589, 590, 591, 522; 174/52.5

[56] References Cited

UNITED STATES PATENTS

| | | | |
|---|---|---|---|
| 3,356,914 | 12/1967 | Whigham et al. | 317/234 |
| 3,486,083 | 12/1969 | Takada | 317/234 |
| 3,037,800 | 6/1962 | Laverty et al. | 29/522 X |
| 3,449,506 | 6/1969 | Weinstein et al. | 174/52 |
| 3,059,157 | 10/1962 | English et al. | 317/234 |
| 3,188,536 | 6/1965 | Rittmann | 317/234 |
| 3,506,889 | 4/1970 | Vogt | 317/234 |

*Primary Examiner*—Rudolph V. Rolinec
*Assistant Examiner*—William D. Larkins
*Attorney, Agent, or Firm*—R. J. Wallace

[57] ABSTRACT

A compact power semiconductor device in which the semiconductive element of the device is supported on a copper layer impacted within a recess of a heat sink element. A three-phase, full wave rectifier assembly is disclosed, in which two facing heat sinks have three rectifying devices recessed therein. Facing rectifiers of opposite polarity are paired and connected to separate input terminals with attachments to each heat sink element serving to make connection to the output side of the rectifiers.

1 Claim, 4 Drawing Figures

INVENTORS
David P. Crouch, &
Frank X. Huber, Jr.
BY
R. J. Wallace
ATTORNEY

COMPACT POWER SEMICONDUCTOR DEVICE AND METHOD OF MAKING SAME

BACKGROUND OF THE INVENTION

Considerable effort has been directed toward the manufacture of compact power semiconductor devices. Considerable strides have been made in the packaging or power semiconductive elements. However, the most significant advancements made so far involve discrete packages which must be separately secured to a supporting heat radiating body. On the other hand, it is not new to consider omitting the discrete package and making the semiconductor device as an integral part of the heat radiating body. In such an arrangement the metal body, for example a heat radiator for a power diode or transistor, would also serve as the housing or package for the semiconductor device itself. Various potential advantages of such a construction are immediately apparent, such as cost reduction, increased efficiency, compactness, and the like. However, these advantages are not realized if a reliable device cannto be consistently integrally formed under commercial manufacturing conditions. Considerable difficulty has been experienced in making low cost satisfactory power rectifiers within a recess of a supporting heat sink of a light metal, such as aluminum. As a result, separate, discretely packaged power rectifiers are still used and must be separately attached to the heat sink by bolting, soldering, press fitting or the like. We have found a technique by which an extremely reliable and improved semiconductor device can be simply, consistently and economically produced directly within a recess of a large mass light metal body under commercial manufacturing conditions.

SUMMARY OF THE INVENTION

It is an object of the invention to provide an improved semiconductor device within a recess of a large mass light metal body.

It is also an object of the invention to provide an economical and simply method for consistently producing highly reliable compact power semiconductor devices.

It is a further object to provide improved compact power semiconductor devices, such as rectifiers and the like, and to provide a new compact three-phase, full wave rectifier bridge assembly.

The principal object of the invention is accomplished by impacting a supporting layer of copper within a recess of a light metal alloy body, supporting a semiconductive wafer on the layer of copper, connecting at least one terminal lead to the wafer, and protecting the wafer from its environment. In a compact three-phase, full wave semiconductive rectifier bridge assembly three semiconductor rectifiers are separately so formed in three recesses in each of two heat sinks. The heat sinks are placed adjacent one another in insuating spaced relationship, preferably with the rectifier terminals facing one another. The terminal lead pairs of the adjacent heat sinks are connected together to a common input terminal and the assembly locked together.

BRIEF DESCRIPTION OF THE DRAWING

Other objects, features and advatnages of the invention will become more apparent from the following description of the preferred examples thereof and from the drawing, in which.

DESCRIPTION OF THE PREFERRED EMBODIMENTS

Figure 1:
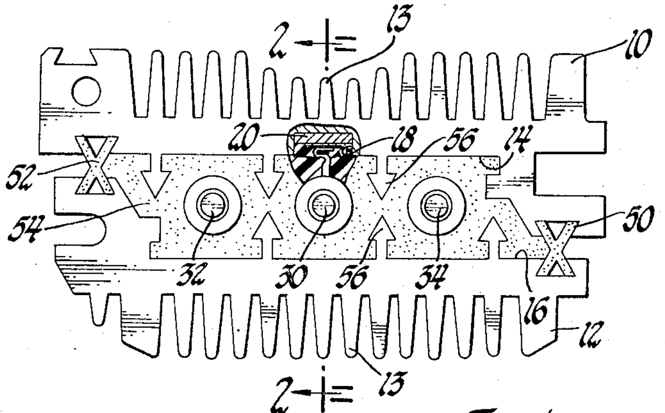
FIG. 1 shows a plan view in partial section of a compact semiconductive rectifier bridge assembly made in accordance with the invention adapted for use within an alternator housing.

FIG. 1 shows a compact three-phase, full wave semiconductive rectifier bridge assembly comprising extruded aluminum heat sink members 10 and 12 which have cooling fins 13 and facing surfaces 14 and 16. Both of the heat sink elements 10 and 12 have three circular recesses with relatively flat end walls in their facing surfaces 14 and 16. Only one recess (reference numeral 18) is shown in FIG. 1. The recesses 18 and 18' in the respective heat sink elements 10 and 12 are correspondingly disposed as can be seen in connection with FIG. 2.

Figure 3:
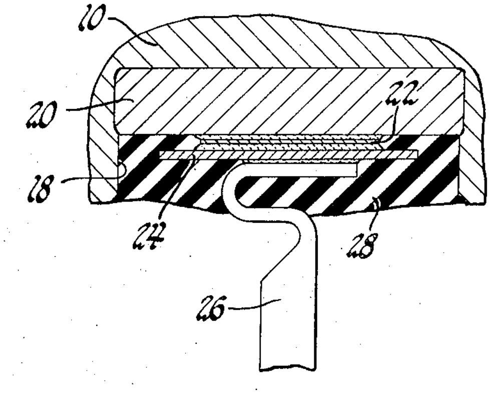
FIG. 3 shows an enlarged fragmentary view of the partial section portion of FIG. 1.

A semiconductive rectifier is formed within each recess, as can be seen more clearly in connection with FIG. 3. A layer 20 of impacted copper is seated within the extremity of the recess. One surface of a semiconductive rectifier wafer 22 is soldered to the copper layer 20. The opposite surface of the rectifier wafer 22 is soldered to a molybdenum disk element 24 which is in turn soldered to a flexible terminal lead 26. The remainder of the recess is filled with room temperature vulcanizable (RTV) silicone rubber 28.

Referring back to FIG. 2, terminal 26 is in turn connected by resistance welding, such as spot welding, to stud 30 which serves as an input terminal connection for the rectifier in recess 18. Facing surface 16 on heat sink element 12 also contains a recess 18', as previously indicated. A rectifier is identically constructed in recess 18' on a self-supporting layer 20' of impacted copper as described in connection with FIG. 3. However, the polarity of the rectifier wafer is oriented oppositely. Terminal lead 26' is also resistance welded to the same terminal stud 30 as terminal lead 26 so that stud 30 serves as a common input for the rectifiers in both recesses 18 and 18'.

Rectifiers are also identically formed in the other recesses mentioned (but not shown) in heat sink elements 10 and 12 associated with terminal studs 32 and 34. Hence, transverse cross sections through stud areas 34 and 32 in FIG. 1 are substantially identical to that shown through stud 30 in FIG. 2. The polarity of three rectifiers in heat sink 10 are all oriented positively and the three rectifiers in heat sink 12 are all oriented negatively. X-shaped elements 50 and 52, of a dielectric material, are in mated undercut grooves in the facing surfaces of the heat sinks. A plastic composition 54, such as epoxy resin, lies in the region between heat sinks 10 and 12 and the X-shaped members 50 and 52. "Arrowheads" 56 enhance adhesion of the plastic 54 to the heat sinks.

Figure 4:
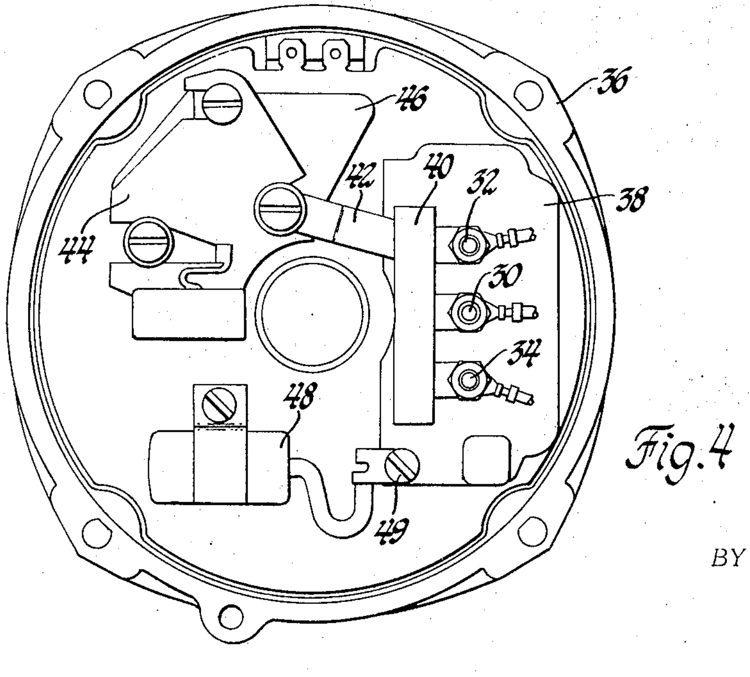
FIG. 4 shows an outline drawing of an alternator end frame assembly containing a rectifier bridge assembly, such as shown in FIG. 1.

The FIG. 1 rectifier bridge assembly is intended for use within an alternator end frame 36, as shown in FIG. 4. The rectifier bridge assembly is designated by reference numeral 38 in FIG. 4. A diode trio 40 and the alternator phase windings are attached to terminal studs 30, 32 and 34. The cathodes of the three diodes in diode trio 40 are connected to a common conductor 42 whicn is in turn connected to brush holder assembly 44 and an integrated circuit voltage regulator 46 all within the alternator end frame. A condenser 48 is also mounted in the end frame and connected to one side of the diode bridge 38, as usual, by a bolt 49.

In making the rectifier bridge assembly shown in the drawings, each of the individual heat sink elements 10 and 12 are separately formed by extruding a suitable light metal alloy into the proper cross-sectional shape. The extruded shape is then cut transversely to produce the discrete heat sink member 10. Wrought aluminum alloys, such as 2S, 3S, 4S, 52S, 14S, 17S, 24S and the like, can be used as the light metal alloy, as well as pure aluminum. By the term "light metal alloy" as used herein we mean to include both pure aluminum as well as aluminum alloys, magnesium, and other lower density alloys that might be satisfactory as a heat radiating member.

Each of the rectifiers in the heat sinks are made in the same way. Hence, only the one shown in FIG. 1 shall be described. A flat bottomed hole is drilled in the surface 14 of the heat sink 10 to form a circular recess 18 of about 0.312 inch in diameter and 0.13 inch in depth. A circular copper disk 20 of about 0.310 inch in diameter and 0.067 inch in thickness is pressed into the recess against the bottom of the hole sufficiently to lock the copper disk in place. Sufficient pressing force should be used to laterally extend the copper somewhat and cause complementary lateral deformation of the aluminum adjacent the copper. We term this step "impaction." Preferably the copper disk is pressed sufficiently to reduce its thickness about 0.01 inch. Essentially pure copper is preferred, such as oxygen-free high-conductivity (OFHC) copper, M-9412, OFHC copper plus a trace of silver, but copper alloys of other compositions may also prove to be useful. By the term "copper" we mean to include pure copper and suitable alloys thereof.

The precise dimensions of the copper layer will vary according to the size of the recess and the nature of the semiconductor wafer with which it is associated. However, for most power applications the copper layer must be at least as thick as the semiconductive element, and preferably at least twice as thick. In addition, in our preferred example of the invention, we prefer a width (or diameter) to thickness ratio not in excess of 10:1 and preferably about 6:1. In any event, it is desired that the copper layer have sufficient thickness to provide adequate support for the semiconductive element and provide adequate heat transfer, apparently laterally, to the aluminum heat sink member to dissipate the heat as required for the particular semiconductive wafer which is attached to it.

To assemble the rectifier, a preform of 92.5 percent lead, 5.0 percent indium, 2.5 percent silver solder is placed on the impacted copper layer. The solder preform is a circular disk about 0.125 inch in diameter and 0.003 inch in thickness. A 0.15 inch by 0.007 inch wafer of silicon is placed on the solder preform. The wafer has a PN junction separating its major faces. A pretinned and solder coated molybdenum disk is placed on the wafer and the end of the input terminal is placed in contact with the molybdenum disk. The assembly is then heated to an appropriate temperature to fuse the solder, preferably in a reducing atmosphere, and then it is cooled back down to room temperature to secure the assembly together. After the soldering operation the balance of recess 18 is filled with a room temperature vulcanizable silicone rubber to seal the rectifiers within the recess. If desired, the silicone rubber can be cured at an accelerated rate by heating in an oven.

In this manner a rectifying device is produced in each of the three recesses formed in each of the two heat sink members 10 and 12. All three semiconductor wafers used in making the three rectifiers in a heat sink are oriented to have the same polarity. However, the polarity of the rectifiers in heat sink 10 are opposite to those of heat sink 12.

Figure 2:
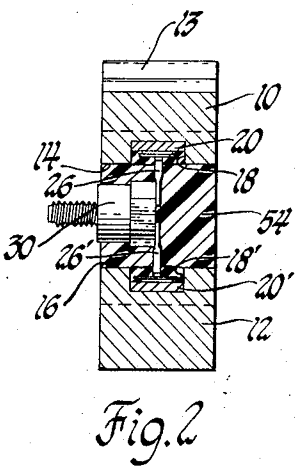
FIG. 2 shows a sectional view along the line 2—2 of FIG. 1.

The heat sinks 10 and 12 are then arranged with their recesses in facing relationship as shown in FIGS. 1 and 2. The X-shaped insulators are placed in the mating grooves in the facing surfaces of the heat sinks to lock the heat sinks next to one another in spaced insulating relationship. The X-shaped members preferably extend across substantially the entire thickness of the heat sink elements to serve as damming for a plastic potting composition which can then be cast in the cavity defined by heat sink surfaces 14 and 16 and the X-shaped connector elements 50 and 52. An appropriate masking tape can be applied to one side of this cavity to form a bottom wall for the casting cavity, if needed. The epoxy resin is simply poured into the cavity sufficient to fill it and enclose the portions of the stud elements 30, 32 and 34 which extend into it.

The hereinbefore described technique for producing a sealed rectifier within a relatively large mass light metal body can be used to make other power semiconductor devices as well as rectifiers. In addition, the semiconductive material can be of other material than silicon, including both elemental and compound semiconductors. The semiconductive element need not be simply a diode element but may also be a triode or even a monolithic integrated circuit element. Also, the hermetic seal while preferably accomplished with silicone rubber can also be accomplished by other techniques. For example, a cover or cap element can be soldered, cold or hot welded in place. A silicone grease might even be useful.

It is therefore to be understood that although this invention has been described in connection with certain specific examples thereof no limitations is intended thereby except as defined in the appended claims.

We claim:

1. A compact high power semiconductor device bridge assembly which comprises at least two proximate spaced mutually insulated heat sinks, said heat sinks having facing surfaces with at least one recess in each of said surfaces, each of said recesses being of a given depth, side and end walls in each of said recesses, a disk of copper in each of said recesses, said disk having two faces spaced by a circumferential edge of a given thickness, said thickness being substantially less than the depth of said recesses, one face of said disk abutting said end wall and said disk edge engaging said recess side wall to wedge said disk in place, a wafer of semiconductive material supported on each of said copper disks, each of said wafers having a PN junction therein separating its two major faces, silicone rubber sealing said recesses, discrete terminal leads electrically contacting each of said wafers and extending out of said recesses through said silicone rubber, a conductive stud interconnecting terminal leads from said recesses in said facing surfaces, said stud being electrically insulated from said heat sinks, complementary pairs of transverse undercut grooves in said facing surfaces on opposite sides of said recesses, a nonconductive retainer element interlocked within each of said complementary pairs of grooves thereby forming a cavity between said heat sinks, said nonconductive retainer element having an X-shaped cross section and a longitudinal extension substantially across the heat sinks serving as a damming for a plastic resin therebetween, a plastic resin filling the cavity between the heat sinks and said insulating members, and means on said heat sinks to enhance adhesion of the said plastic resin to said heat sinks.

* * * * *